United States Patent US 8,663,977 B2
Adhiprakasha
Mar. 4, 2014

(54) VERTICALLY RETRACTABLE FLOW CELL SYSTEM

(75) Inventor: Edwin Adhiprakasha, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 258 days.

(21) Appl. No.: 13/313,213

(22) Filed: Dec. 7, 2011

(65) Prior Publication Data

US 2013/0145587 A1 Jun. 13, 2013

(51) Int. Cl.
*C12M 3/00* (2006.01)

(52) U.S. Cl.
USPC ......................................... 435/288.5

(58) Field of Classification Search
None
See application file for complete search history.

(56) References Cited

U.S. PATENT DOCUMENTS

| | | | |
|---|---|---|---|
| 5,603,351 | A | 2/1997 | Cherukuri et al. |
| 6,758,951 | B2 | 7/2004 | Giaquinta et al. |
| 6,902,934 | B1 | 6/2005 | Bergh et al. |
| 7,432,006 | B2 | 10/2008 | Li et al. |
| 7,625,748 | B2 * | 12/2009 | Ogura et al. ............. 435/288.5 |
| 8,084,400 | B2 * | 12/2011 | Chiang et al. ................ 506/23 |
| 2003/0032198 | A1 | 2/2003 | Lugmair et al. |
| 2003/0049862 | A1 | 3/2003 | He et al. |
| 2009/0068849 | A1 * | 3/2009 | Endo et al. ................. 438/763 |
| 2009/0155936 | A1 * | 6/2009 | Weiner et al. ................. 438/17 |

FOREIGN PATENT DOCUMENTS

WO 2013016036 A1 1/2013

OTHER PUBLICATIONS

Smith, R., et al.; Combinatorial Chemical Vapor Deposition. Achieving Compositional Spreads of Titanium Tin and Hafnium Oxides by Balancing Reactor Fluid Dynamics and Deposition Kinetics; Dec. 6, 2002; Chemistry of Materials, vol. 15, No. 1; American Chemical Society; pp. 292-298.

Xia, B., et al.; Balancing Reactor Fluid Dynamics and Deposition Kinetics to achieve Composition Variation in Combinatorial Chemical Vapor Depositions; 2003; Elsevier B.V.; Applied Surface Science; pp. 14-19.

Whitacre, J.F., et al.; A Combinatorial Study of LiyMnxNi2-xO4 Cathode Materials Using Microfabricated Solid-State Electrochemical Cells; Oct. 23, 2003; Journal of the Electrochemical Society, vol. 150, Issue 12; pp. A1676-A1683.

Fleischauer, M. D., et al.; Design and Testing of a 64-Channel Combinatorial Electrochemical Cell; Sep. 19, 2003; Journal of the Electrochemical Society, vol. 150, Issue 11; pp. A1465-A1469.

Liu, R., et al.; Array Membrane Electrode Assemblies for High Throughput screening of Direct Methanol Fuel Cell Anode Catalysts; Aug. 13, 2002; Elsevier B.V.; Journal of Electroanalytical Chemistry; pp. 49-55.

Flamac; Modular Platform for High-Throughput Formulation of Highly Viscous Fluids and Powders; Flamac VZW; http://www.flamac.be/wp-content/uploads/2010/01/vf_hte_en1.pdf; 2 pages.

* cited by examiner

*Primary Examiner* — Charles Garber
*Assistant Examiner* — Andre' C Stevenson

(57) ABSTRACT

A system for combinatorial processing is provided. The system includes a plurality of reactor cells. Each of the plurality of reactor cells includes a vertical recess extending along a length of the outer surface of the plurality of reactor cells. The vertical recess is operable to receive a vertical rail. The system also includes a plurality of horizontal rails extending between rows of the plurality of reactor cells. Each of the plurality of horizontal rails has a member slidably mounted thereon. The member is coupled to the vertical rail thereby enabling independent horizontal and vertical movement for each of the plurality of reactor cells.

16 Claims, 9 Drawing Sheets

VERTICALLY RETRACTABLE FLOW CELL SYSTEM

BACKGROUND

Combinatorial processing enables rapid evaluation of semiconductor processes. The systems supporting the combinatorial processing are flexible to accommodate the demands for running the different processes either in parallel, serial or some combination of the two.

Some exemplary semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

During combinatorial experiments it is beneficial to provide as much flexibility as possible with regard to the tools performing the processing. For example, some of the processing cells may be performing processing operations while others are not being utilized. It is within this context that the embodiments arise.

SUMMARY

Embodiments of the present invention provide an apparatus that enables independent vertical and horizontal movement for the flow cells of a combinatorial processing system. Several inventive embodiments of the present invention are described below.

In some embodiments of the invention, a system for combinatorial processing is provided. The system includes a plurality of reactor cells. Each of the plurality of reactor cells includes a vertical recess extending along a length of the outer surface of the plurality of reactor cells. The vertical recess is operable to receive a vertical rail. The system also includes a plurality of horizontal rails extending between rows of the plurality of reactor cells. Each of the plurality of horizontal rails has a member slidably mounted thereon. The member is coupled to the vertical rail thereby enabling independent horizontal and vertical movement for each of the plurality of reactor cells.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
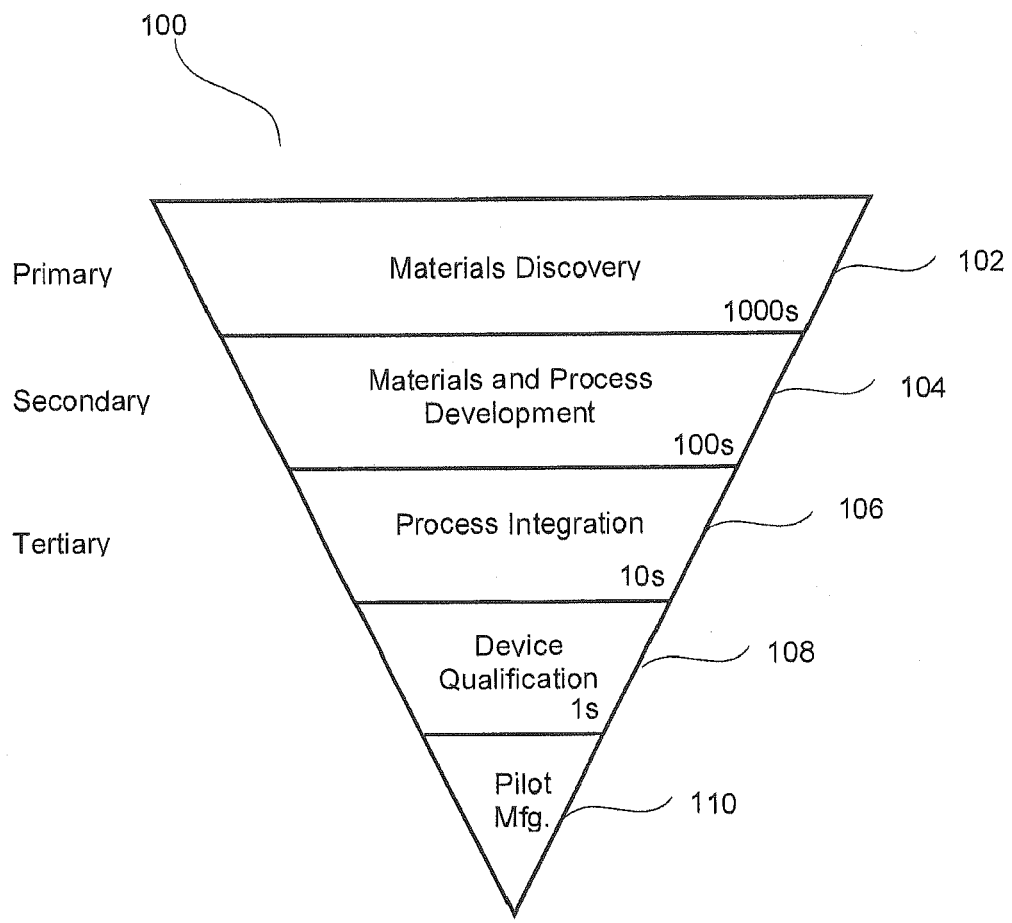
FIG. 1 illustrates a schematic diagram for implementing combinatorial processing and evaluation using primary, secondary, and tertiary screening.

The embodiments described herein provide a method and apparatus for a modular combinatorial processing system with vertically retractable processing heads for efficient reconfiguration of a site isolated reactor. It will be obvious, however, to one skilled in the art, that the present invention may be practiced without some or all of these specific details. In other instances, well known process operations have not been described in detail in order not to unnecessarily obscure the present invention.

The embodiments described below provide site isolated reactors having configurable dispense heads for combinatorial processing. The modular design enables simplified changeover to meet the demands of combinatorial processing. The system also enables adjusting the spacing of the reactors and flow cells to accommodate different substrates, die configurations, test structure locations, etc. This adjustment system can be used with the modular flow cell mentioned above or a monolithic block design in which both the reactor and the facilities interface are combined into one integral unit. The embodiments further describe a method and system where the reactor cells for the system, such as the F30 system of the assignee, have independent vertical and horizontal movement. The rail system is adopted to include a member on each horizontal rail where the member couples to a recessed slot defined within a section of each reactor cell. The recessed slot extends vertically across a surface of each of the reactor cells. Thus, the reactor cell can move vertically while the member is stationary on the horizontal rail and/or the reactor cell can move horizontally as the member is slidably mounted on the rail. In some embodiments the recess and the member have a trapezoidal shape and both components can be composed of Polytetrafluoroethylene. In some embodiments, each reactor cell is controlled through a dedicated motor which is controlled through a controller for the system.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
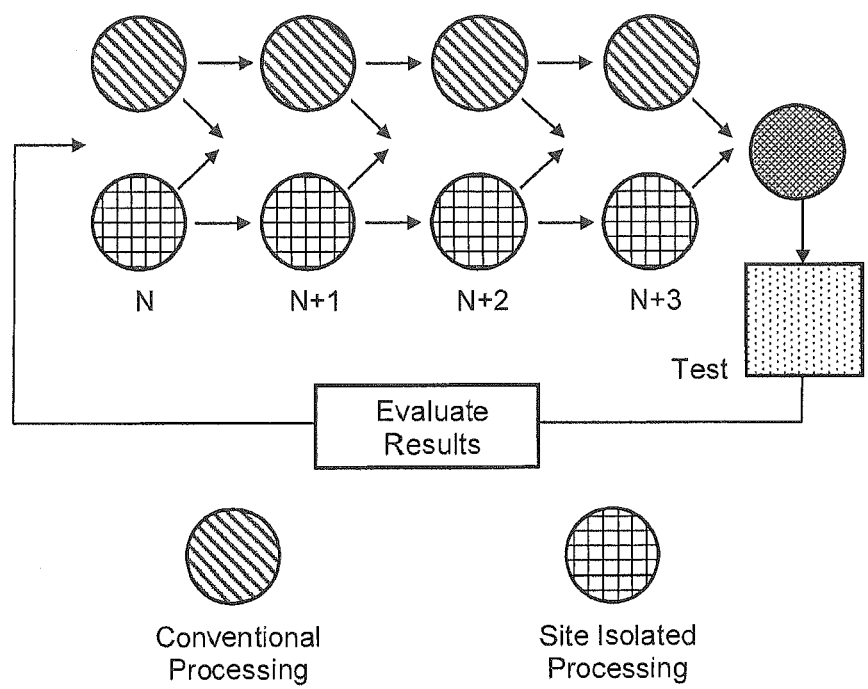
FIG. 2 is a simplified schematic diagram illustrating a general methodology for combinatorial process sequence integration that includes site isolated processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3A:
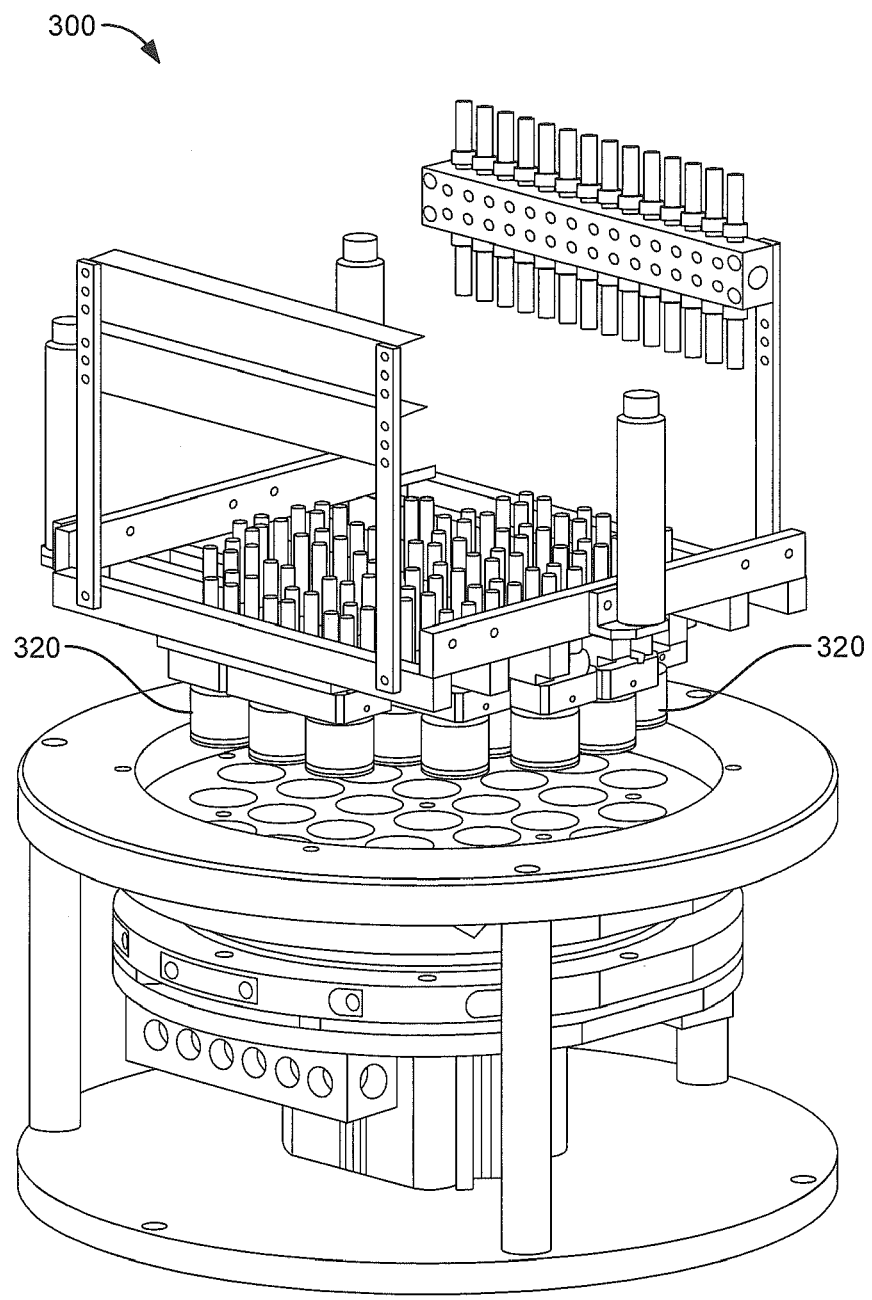
FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention.

FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention. System 300 includes a plurality of flow cells 320 which may be modular in design as described further below in order to efficiently evaluate a plurality of processes and utilize the same tool on various programs addressing customer specific problems and enabling the use of using customer specific wafers without requiring re-tooling. In some embodiments, twenty eight flow cells are provided for twenty eight discrete regions of a twelve inch wafer. It should be appreciated that this is not meant to be limiting as any number of flow cells may be accommodated on a system depending on various factors including the size and shape of the substrate being evaluated, the size of the regions on the substrate, etc. In the discussion below, a monolithic block design is first described and then a modular design is later described for illustrative purposes since either can be used in certain aspects of the invention. In addition, a rail system enabling flow cells 320 to be tailored to any pitch (e.g., spacing) of regions is provided. A flexible reactor based system is also described in addition to a static manifold system. System 300 includes a plurality of connections (not shown for illustrative purposes) distributed to each of flow cells 320. Through the embodiments described below, the facilities connections remain intact, while the process module can be replaced with an alternative process module and mated with the facilities module through kinematic coupling in one embodiment.

One skilled in the art will appreciate that the system of FIG. 3A may be connected to various inputs that may be affixed to system 300 through racks or external to system 300. Exemplary inputs include a dispense manifold to dispense any process fluids utilized in the system, a mix vessel for optionally mixing fluids prior to delivery to system 300, and any required power and gas inputs to operate the system. In addition, a waste collection mechanism may be in communication to receive process fluids evacuated from the reaction chambers or bypassed through flow cells 320. It should be further appreciated that while flow cells 320 are depicted as each having four inputs and four outputs, the number of inputs and outputs may be varied to more or less than four as the illustrations are exemplary.

Figure 3B:
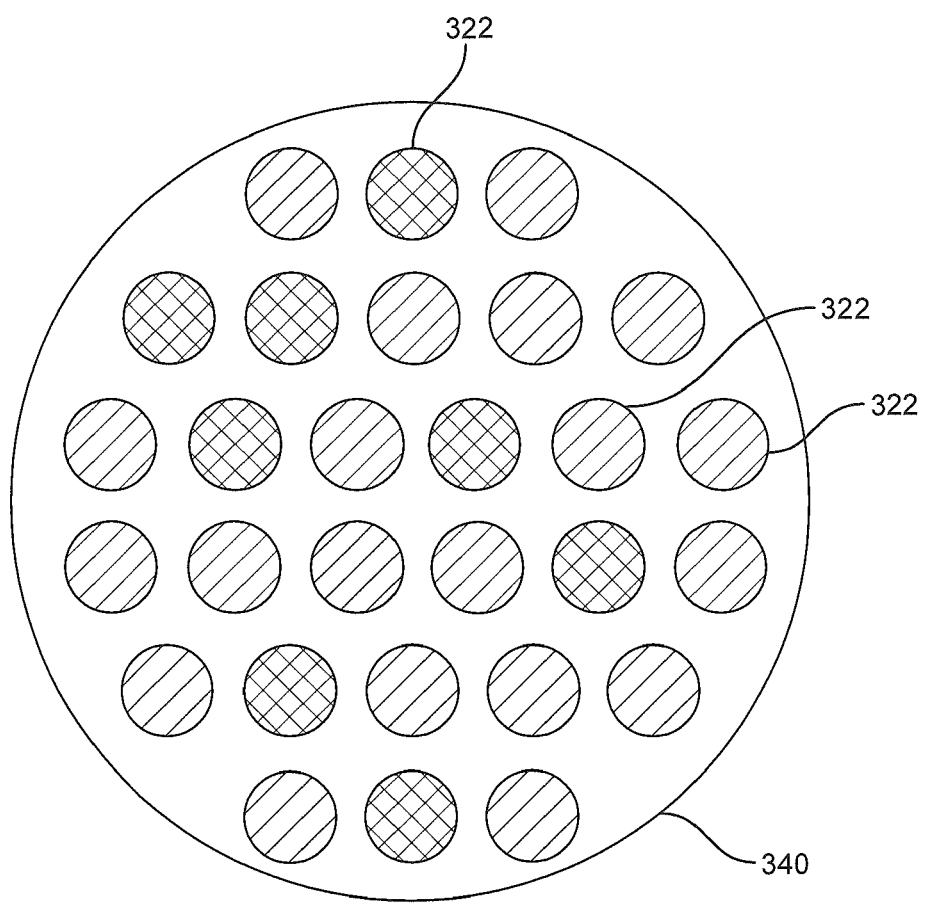
FIG. 3B is a top view of a substrate having regions processed differently through the modular head system described herein in accordance some embodiments of the invention.

FIG. 3B is a top view of a substrate having regions processed differently through the modular head system described herein in accordance with some embodiments of the invention. Substrate 340 has a plurality of regions 322, which have been combinatorially processed. Twenty eight regions are provided on substrate 340 in this exemplary embodiment. More or fewer regions can be defined in alternative embodiments. It should be appreciated that on substrate 340 a wealth of knowledge exists on a single substrate as each of regions 322 may have some property or characteristic of the process altered. Thus, the information available for each region as well as the interaction of each region with previous or subsequent process operations or materials may be harvested to provide data on an optimum material, unit process and/or process sequence in a highly efficient manner. While FIG. 3B illustrates regions 322 as isolated and not overlapping, the regions may overlap in some embodiments. In some embodiments a region refers to a localized area on a substrate which is, was, or is intended to be used for processing or formation of a selected material. The region can include one region and/or a series of regular or periodic regions preformed on the substrate. The region may have any convenient shape, e.g., circular, rectangular, elliptical, wedge-shaped, etc. In some embodiments, regions 322 are predefined on the substrate. However, the processing may define the regions 322 in some embodiments.

Figure 4:
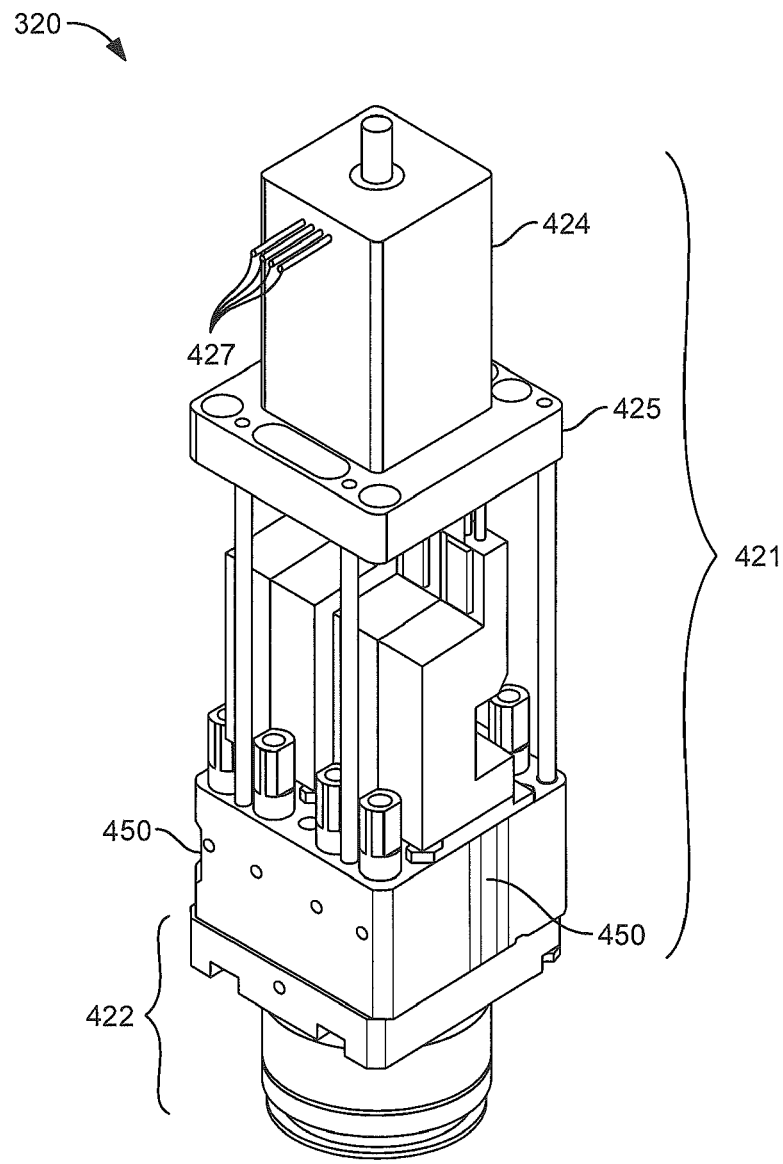
FIG. 4 is a simplified schematic diagram of a modular process head configured to adjust to a pitch or provide a variable pitch of regions on a substrate, as well as being vertically retractable in accordance with some embodiments of the invention.

FIG. 4 is a simplified schematic diagram of a modular process head configured to adjust to a pitch or provide a variable pitch of regions on a substrate, as well as being vertically retractable in accordance with some embodiments of the invention. The pitch is the spacing between the flow cells which should be matched to the regions on the substrate, which may vary by customer or application (e.g., due to die size difference, test structure location, or other requirements) and thus another embodiment of the invention enables the flow cells to be easily moved to adjust for the variable pitch. Modular flow cell 320 includes drive 424 having electrical connections 427 and corresponding facilities module 421 mounted on process module 422. In some embodiments, facilities module 421 may include conductive traces that mate with corresponding conductive traces of process module 422. The conductive traces within process module 422 may bring a voltage or current to any portion of the reaction region or substrate surface in order to enable an interaction or step of the process. Alternatively, the conductive traces within process module 422 may be utilized to send or receive signals to or from a monitoring device configured to provide data for characterizing the reaction or process taking place within a reaction region. Thus, in one case, the conductive trace may provide an electrical signal that actively participates in the combinatorial processing and in another case the conductive trace may passively monitor the combinatorial processing. Exemplary monitoring devices may include a pH probe, temperature probe, pressure gauge, flow meter, etc. Facilities module 421 is configured to provide facility process supplies, i.e., process gasses, chemicals, electricity, or any other process consumable utilized during the processing, through a standard interface in accordance with one embodiment of the invention.

Within a lower portion of facilities module 421, vertical slot 450 is defined thereon in order to couple to a vertical rail and a mounting member, which in turn couples to a horizontal rail so that a plurality of the flow cells 320 may be combined as described with regards to FIGS. 5-8B. In FIG. 4, slot 450 may be designed on opposing sides, or may be provided or embedded on only one side, of the flow cell 320 in order for the vertical rail to support flow cell 320. Drive 424 is mounted on platform 425, which is supported by posts connected to the lower portion of facilities module 421, but may be mounted in other ways based on design choices.

Figure 5:
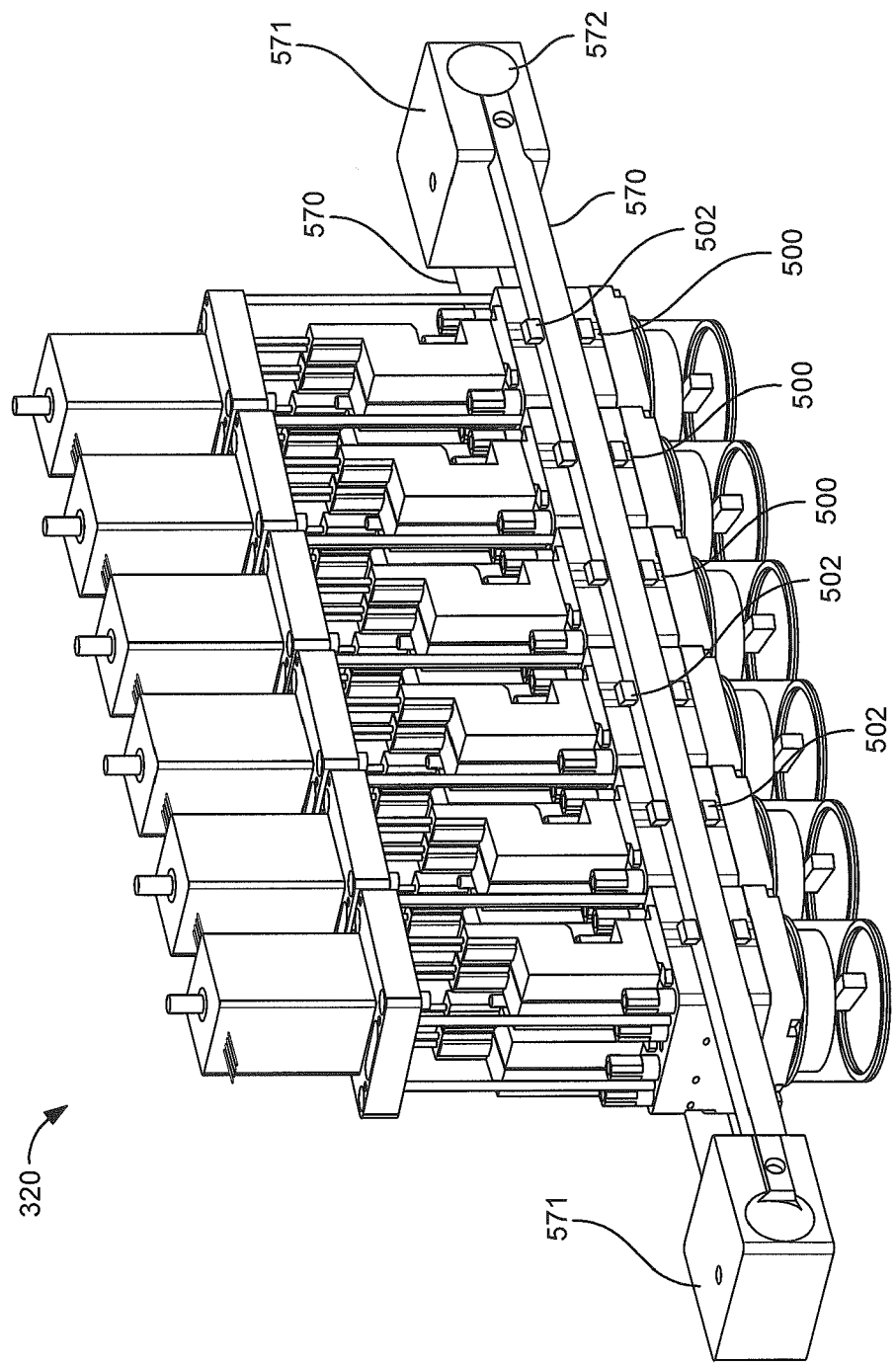
FIG. 5 is a simplified schematic diagram illustrating a plurality of flow cells accommodated through a rail in accordance with some embodiments of the invention.

FIG. 5 is a simplified schematic diagram illustrating a plurality of flow cells accommodated through a rail in accordance with some embodiments of the invention. Rail 170 will support a row of flow cells 320. As illustrated, rails 570 are attached to corresponding sides of the facilities modules of the flow cells, though it may be coupled to only one side and may be coupled to either the facilities or process portion in case of the modular flow cell. Rails 570 are connected to blocks 571 which are slideably mounted onto a rod or support member (not shown) through holes 572 for support over the surface of a substrate in this embodiment. As illustrated in FIG. 5, each one of flow cells 320 is slidable in order to adjust to any pitch (i.e., the distance between cells) necessary as desired or defined by a corresponding substrate to be processed. The flow cells can be set in place, e.g., through a set screw against rails 570, in some embodiments. Alternatively, as the process module will be inserted into a process chamber, the tolerances may be such that the flow cells need not be set in place. It should be appreciated that blocks 571 may be adjusted vertically through some suitable mechanism in order to lift and lower the flow cell, e.g., from a reactor block. While flow cells 320 are illustrated with similar process modules disposed thereunder, it should be appreciated that any number of process modules may be incorporated into the flow cells whether the process modules are identical or different. That is, each of the flow cells may have different process modules as dictated by the experiment being performed. Accordingly, the flexible nature of the flow cells and the support structure enables further combinations of tests or process sequences to be performed on a single substrate.

Figure 6:
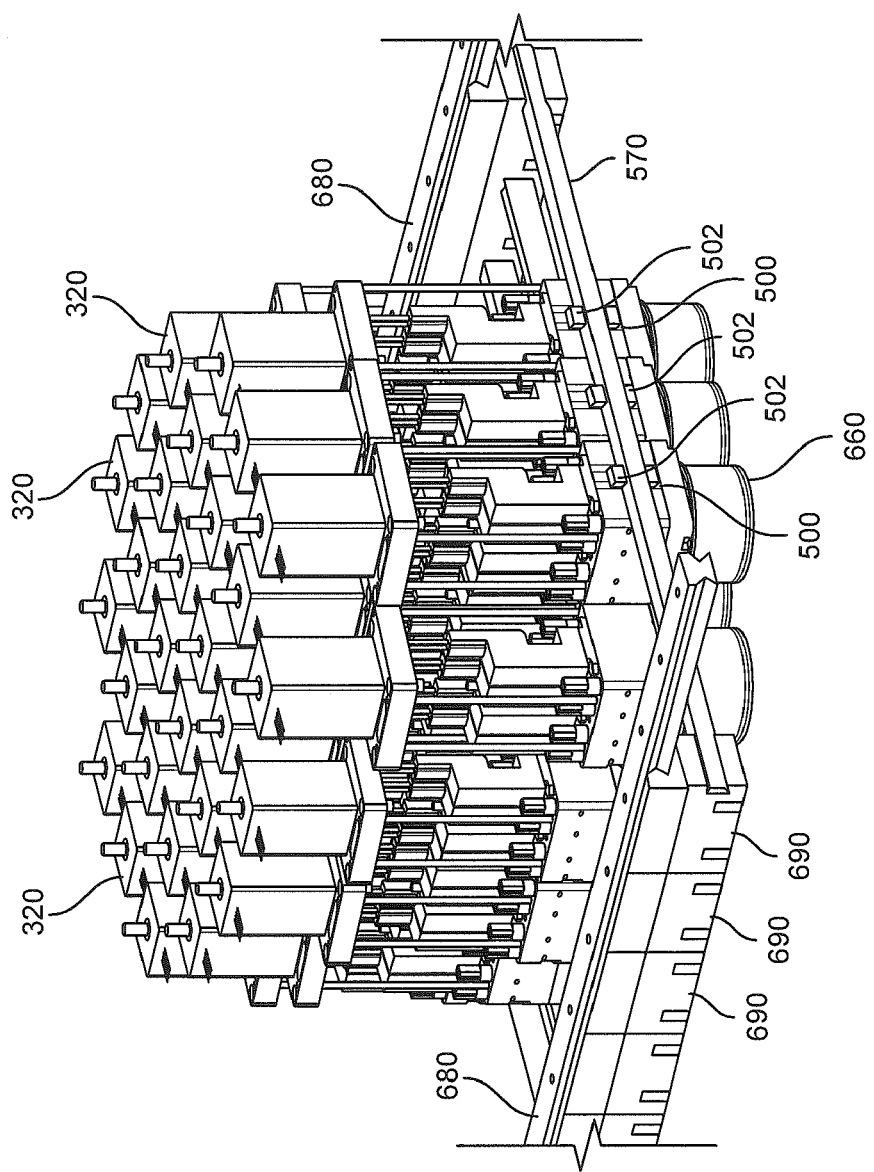
FIG. 6 is a simplified schematic diagram illustrating the details of the flow cells mounted onto a system to accommodate a desired pitch of a substrate to be processed in accordance with some embodiments of the invention.

FIG. 6 is a simplified schematic diagram illustrating the details of the flow cells mounted onto a system to accommodate a desired pitch of a substrate to be processed in accordance with some embodiments of the invention. Flow cells 320 are mounted on corresponding rails 570 which are supported through rails 680. A modular design is provided for flow cells 320 as well as modular blocks 690 for each corresponding row of flow cells. For example, the modular blocks 690 can be moved to adjust the pitch along the rail 680. In some embodiments, a modular sleeve enclosure is provided for a lower portion of each process module in one embodiment, thereby enabling adaptability of the system to any pitch of regions on a substrate. In the manner described above, flow cells 320 may be moved in one linear direction as they are slideably mounted on rails 570 of one rail system and the corresponding rows to which each flow cell belongs is slideably mounted on rails 680 of a second rail system. Thus, the movement of the rows along rails 680 is in a linear direction substantially perpendicular to the direction of movement along rails 570, enabling access to the entire surface of a substrate disposed thereunder. In this embodiment, the first row of flow cells includes three flow cells while the next row includes five and the row thereafter includes six. This pattern is repeated for the next three rows so that a total of twenty eight flow cells are accommodated in this configuration. For example, a twelve inch wafer having the twenty eight regions could be accommodated in this design. Of course, this design is not meant to be limiting as the size and shape of the flow cells or the size and shape of the substrate to be processed may be any suitable geometric shape. Those dimensions and characteristics will inform the specific default configuration of the flow cells and their positioning for any specific process. Since each flow cell is modularly designed a number of different experiments may be provided with the twenty eight corresponding flow cells. In addition, certain flow cells may be set aside or parked outside the area of the substrate to be processed as rails 570 and 680 are configured to enable enough space to accommodate one or more flow cells 320 outside of the substrate boundary region. For example, one whole row of flow cells 320 may be moved along rails 680 outside of the substrate boundary region. Thus, through the slidable mounting and rail configuration any pitch for any substrate may be accommodated with this design. It should be noted that the monolithic flow cells or any other suitable type of flow cell may be integrated with the rail system described herein as the embodiments depicting the modular flow cells are not meant to be limiting.

Figure 7:
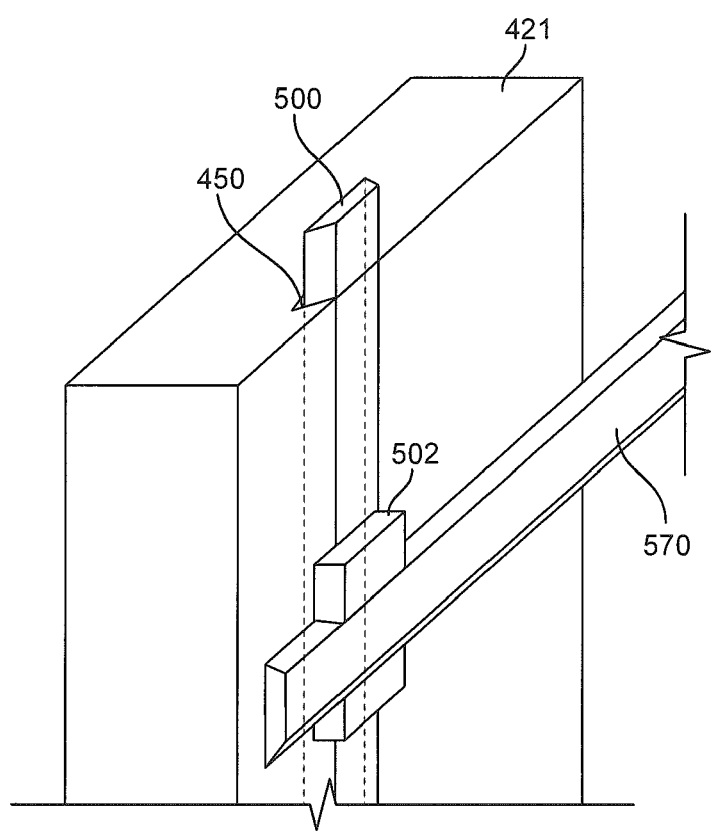
FIG. 7 is a simplified schematic diagram illustrating a perspective view of the details of the mounting system for each of the flow cells in accordance with some embodiments of the invention.

FIG. 7 is a simplified schematic diagram illustrating a perspective view of the details of the mounting system for each of the flow cells in accordance with some embodiments of the invention. Lower portion of facilities module 421 of the flow cell is illustrated having a vertical recess 450 defined along a surface of facilities module 421. Vertical rail 500 is disposed within vertical recess 450 mounting member 502 is affixed to vertical rail 500. Horizontal rail 570 is coupled to facilities module 421 of the flow cell through mounting member 502 and vertical rail 500. Mounting member 502 is slidably mounted onto horizontal rail 570. It should be appreciated that mounting member 502 is rigidly affixed to vertical rail 500 in some embodiments. Thus, the flow cell is capable of sliding along vertical rail 500, as vertical rail 500 remains stationary. In addition, the flow cell is able to horizontally slide along horizontal rail 570, while the horizontal rail remains stationary. It should be appreciated that horizontal rail 570 is slidable in a plane that is orthogonal to a plane defined by a row of the vertical rails 500. Thus, where one or more of the flow cells is not being used to process a region of the substrate, the particular flow cell or cells can be vertically raised so as to not contact the substrate and cause any abrasion or particles when the flow cell is not being used. It should be further appreciated that the vertical raising of the flow cell enables easier servicing of the flow cells to further minimize downtime of the tool. In one embodiment, horizontal rail 570 and vertical rail 500 are composed of a metal, such as aluminum, while the flow cell and mounting member 502 are composed of a suitable plastic, such as TEFLON™.

Figure 8A:
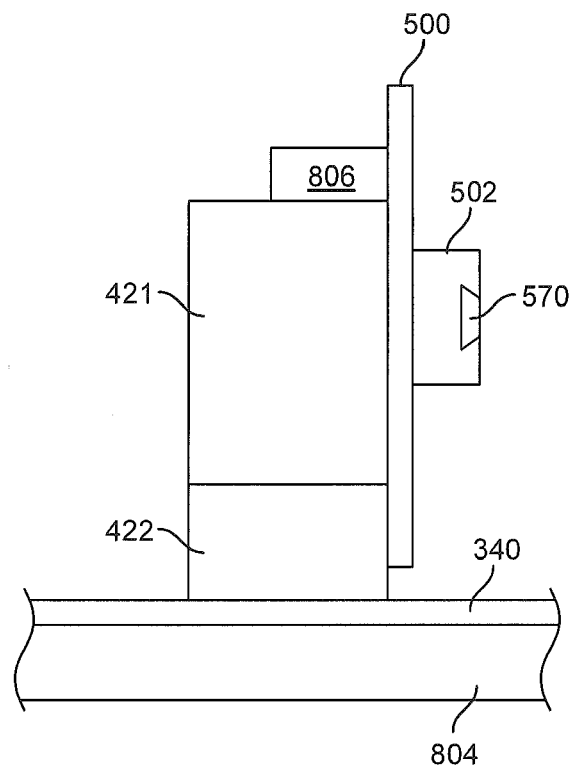
FIG. 8A is a simplified schematic illustrating a cross-sectional view of the mounting system enabling independent horizontal and vertical movement for each of the flow cells in accordance with some embodiments of the invention.

FIG. 8A is a simplified schematic illustrating a cross-sectional view of the mounting system enabling independent horizontal and vertical movement for each of the flow cells in accordance with some embodiments of the invention. Vertical rail 500 is disposed in a vertical recess defined on a surface of facilities module 421 of the flow cell. Facilities module 421 is disposed over and may be detachably mounted to process module 422 of the flow cell. It should be appreciated that vertical rail 500 may be disposed along a vertical recess defined in both sections 421 and 422 of the flow cell in alternative embodiments. Mounting member 502 is affixed to vertical rail 500 and is coupled to horizontal rail 570. The flow cell is disposed over a substrate 40 which is placed on chuck 804. Process module 422 of the flow cell will define a reaction region on substrate 340. Drive 806 is mounted onto a top surface of facilities module 421 of the flow cell and provides the mechanism for moving the flow cell along vertical rail 500. It should be appreciated that each flow cell may include a drive mounted thereon in order to provide the independent vertical movement. In some embodiments drive 806 may be coupled to a controller, such as a computing device, and controlled through software in contrast to manually being raised.

Figure 8B:
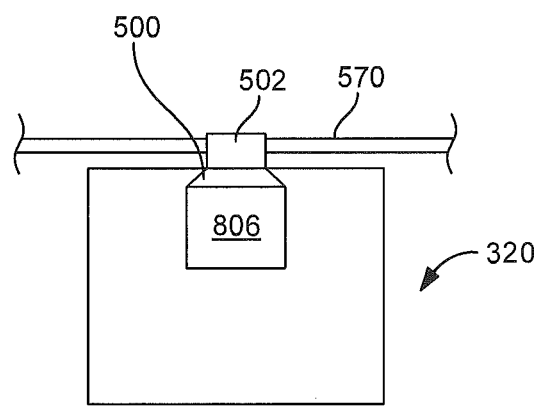
FIG. 8B is a simplified schematic diagram illustrating a top view of the mounting system enabling the independent horizontal and vertical movement for each of the flow cells in accordance with some embodiments of the invention.

FIG. 8B is a simplified schematic diagram illustrating a top view of the mounting system enabling the independent horizontal and vertical movement for each of the flow cells in accordance with some embodiments of the invention. Horizontal rail 570 extends across the system and is coupled to mounting member 502. Mounting member 502 was affixed to vertical rail 500 which is disposed within vertical recess 450 of flow cell 320, which consists of facilities module 421 detachably affixed to process module 422. It should be appreciated that while the horizontal rail 570 and vertical rail 500 are illustrated on one side of flow cell 320, this is not meant to be limiting. That is, opposing sides of flow cell 320 may include mirror images of each other are so that the horizontal and vertical rails are each disposed along the opposing sides. While horizontal rail 570 and vertical rail 500 are illustrated as trapezoidal shapes that mate with corresponding trapezoidal openings, it should be appreciated that the rails and opening may be any suitable shape and are not limited to the trapezoidal shapes. Further details on the flow cell configuration may be found in U.S. application Ser. No. 12/333,226 entitled "Modular Flow Cell and Adjustment System" filed on Dec. 11, 2008 and claiming priority to U.S. Provisional Application No. 61/013,038 filed on Dec. 12, 2007, both of which are herein incorporated by reference.

It should be appreciated that the system is capable of supporting a number of pitch configurations through the adjustable and modifiable rail configuration. One set of rails can support a row of flow cells that are individually adjustable in a vertical and horizontal direction. The respective ends of these rails may be supported by another set of rails as mentioned above. Thus, the embodiments described herein enable independent movement of the flow cells in three dimensions, i.e., X, Y, and Z directions to allow for further flexibility in designing the combinatorial experiments, as well as ease of servicing the flow cells.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A combinatorial processing system, comprising:
   a plurality of reactor cells; each of the plurality of reactor cells including a vertical recess extending along a length of the outer surface of the plurality of reactor cells, the vertical recess operable to receive a vertical rail; and
   a plurality of horizontal rails extending between rows of the plurality of reactor cells, the plurality of horizontal rails having a member slidably mounted thereon, the member coupled to the vertical rail thereby enabling independent horizontal and vertical movement for each of the plurality of reactor cells.

2. The system of claim 1, wherein the horizontal rail is stationary during vertical movement of one of the plurality of reactor cells.

3. The system of claim 1, wherein the plurality of reactor cells are configured with a first section detachably mounted from a second section, the second section defining a reaction region when contacting a substrate disposed within the system.

4. The system of claim 3, wherein the vertical recess is defined along a surface of the first section.

5. The system of claim 1, wherein a pitch of the plurality of reactor cells is adjustable.

6. The system of claim 1, wherein the vertical rail is stationary.

7. The system of claim 1, wherein each of the plurality of horizontal rails is slidably mounted to a frame of the system.

8. The system of claim 1, wherein the vertical recess has a trapezoidal cross section.

9. A combinatorial processing system, comprising:
   a plurality of independently moveable reactor cells slidably disposed along a horizontal rail, each of the plurality of reactor cells having a vertical recess defined along an outer surface,
   a vertical rail extending through each vertical recess, wherein a mounting member for each of the reactor cells is slidably coupled to the horizontal rail and the mounting member is rigidly affixed to a surface of the vertical rail.

10. The system of claim 9, wherein the horizontal rail and the vertical rail is composed of a metal.

11. The system of claim 10, wherein the mounting member and the reactor cells are composed of Polytetrafluoroethylene (PTFE).

12. The system of claim 9, further comprising:
    a drive mechanism for each of the plurality of reactor cells, the drive mechanism operable to drive the corresponding reactor cell along the vertical rail.

13. The system of claim 9, wherein the horizontal rail is slidably mounted along a frame of the system.

14. The system of claim 9, wherein the vertical recess has a trapezoidal cross section.

15. The system of claim 9, wherein each of the plurality of reactor cells includes a first section and a second section detachably mounted to each other, wherein the first section includes the vertical recess and the second section defines a reaction region on a surface of a substrate being processed by the system.

16. The system of claim 9, wherein a pitch of the plurality of independently moveable reactor cells is adjustable.

* * * * *